United States Patent [19]
Moran et al.

[11] Patent Number: 5,023,557
[45] Date of Patent: Jun. 11, 1991

[54] TESTING PROCESS FOR ELECTRONIC DEVICES

[75] Inventors: Joseph M. Moran, Berkeley Heights; Thomas C. Russell, Hoboken, both of N.J.

[73] Assignee: AT&T Bell Laboratories, Murray Hill, N.J.

[21] Appl. No.: 581,164

[22] Filed: Sep. 5, 1990

Related U.S. Application Data

[63] Continuation of Ser. No. 378,431, Jul. 10, 1989, abandoned, which is a continuation of Ser. No. 99,196, Sep. 21, 1987, abandoned.

[51] Int. Cl.$^5$ .......................................... G01R 15/12
[52] U.S. Cl. ................................... 324/537; 324/690; 324/73.1
[58] Field of Search ................ 324/537, 158 P, 158 F, 324/690, 715, 73.1

[56] References Cited

U.S. PATENT DOCUMENTS 3,695,680 8/1976 Webb .............................. 324/61 P
4,565,966 1/1986 Burr et al. ....................... 324/73 PC

OTHER PUBLICATIONS

A.J. Diefenderfer, *Principles of Electronic Instrumentation*, W. B. Saunders Company, Phila., PA, 1979.

*Primary Examiner*—Gerard R. Strecker
*Assistant Examiner*—Maura K. Regan
*Attorney, Agent, or Firm*—B. S. Schneider

[57] ABSTRACT

Electronic devices such as hybrid integrated circuits such as those having test points spaced less than 1250 $\mu$m are advantageously evaluated utilizing a two-probe process. In this process the probes are moved between test points in a pattern that reduces movement distance without concern for any ordering imposed by the nets themselves or the test to be made. Additionally, the test is made so that the movement time is the limiting factor.

14 Claims, 1 Drawing Sheet

TESTING PROCESS FOR ELECTRONIC DEVICES

This application is a continuation-in-part of application Ser. No. 07/378,431, filed on July 10, 1989 which is a continuation of application Ser. No. 07/099,196 dated Sept. 21, 1987 (both now abandoned).

BACKGROUND OF THE INVENTION

This invention relates to the testing of electronic devices, and in particular, to the testing of electronic devices having conductive nets.

TECHNICAL FIELD

Many devices such as hybrid integrated circuits (HIC) and printed circuit boards employ a series of conductive nets produced on a substrate. These nets have nodes at which a lead from devices such as integrated circuits are attached. For convenience, the nets are generally designed so that the nodes are positioned at intersection points of a cartesian grid. When the devices are attached, the nets are interconnected to produce a desired circuit. Generally, before the devices are attached to the nets, e.g., soldered or welded to the nets, the nets are checked to ensure continuity within each net and to ensure that there are no short circuits between nets. This testing is prudent since, if faults are found after connection of the devices, significant greater costs are incurred either repairing the defect or discarding the completed circuit.

Testing for nets where the nodes are spaced on a grid is generally done by the bed of nails approach. In this approach a test fixture is utilized having a series of projecting pins spatially coinciding with the nodes of the nets to be tested. The pins are aligned so that all node points are contacted by a corresponding pin. Test equipment is then utilized to determine if there is continuity within nets and an absence of shorts between nets. Because all contacts are made simultaneously, bed of nails testing is relatively quick.

However, when the spacing between nodes is closer than 1250 μm or when the nodes are not regularly spaced, it is difficult to fabricate a bed of nails test fixture. For these configurations, bed of nails testing is only economic, if at all, when very large scale production is contemplated. When a bed of nails tester is either not manufacturable or uneconomic, an alternate approach, a two-probe system for testing, has been proposed. In this system a probe is positioned through typical mechanical expedients at one node and the remaining nodes in the net are sequentially contacted by a second probe. Continuity between nodes is tested typically by resistance measurement. The presence of shorts between nets is also tested, e.g., by measuring the capacitance between a single node of the net and a common electrical plane in close proximity to all the nets. (See, U.S. Pat. No. 3,975,680 dated Aug. 17, 1976 which is hereby incorporated by reference for a description of capacitance testing.) The process continues in this manner from net to net until the entire circuit has been tested.

The equipment for two-probe testing is generally less costly than a bed of nails tester. However, for a circuit with a large number of nets, throughput is substantially reduced by any significant increase in measurement time for each node. Measurement times of approximately 3 per second are typical for two-probe testing equipment. Averaged measurement times faster than approximately 100 msec have not been reported. However, measurement times faster than 100 msec, preferably faster than 70 msec, would substantially reduce costs associated with testing. Thus, the two-probe approach to testing has not produced entirely desirable measurement speeds.

SUMMARY OF THE INVENTION

To produce measurement times on typical net configurations faster than 100 msec in a two-probe testing system with acceptable accuracy, a substantially different approach from conventional techniques is required. It has been found that acceleration and velocity of the probes is limited by practical consideration. Cost significantly increases with enhanced probe velocity and acceleration while mechanical integrity must be substantially augmented to dampen the concomitant increase in induced vibration. Thus, merely increasing probe velocity and acceleration is not the solution to improved measurement times.

To decrease measurement time, measurements are made in a sequence that is not based upon the ordering associated with the nets. Net dictated ordering is ignored and probe traveling distance is substantially reduced. For example, an approximation to the traveling salesman problem is utilized to dictate the movement of the probes from node to proximate node irrespective of its net. Additionally, both the resistance and capacitance measurements to be made are not separately performed but are interleaved in a manner to also reduce movement. Thus, it is possible to perform the resistance and capacitance measurements in a manner to reduce traveling distance for the probes.

Other factors should be controlled so that probe travel time is limiting. Since the invention substantially reduces the average distance the probes move the time to make such shorter moves is dominated by probe acceleration and not by maximum velocity. Thus, it is desirable to employ probes capable of relatively high acceleration. Other factors such as the time required for communication between the controlling computer and the drives for the probes should be restricted. Measurement time and the time for deceleration and settling at the point to be measured should also be limited.

In a specific embodiment, a variation of the greedy algorithm approximation to the traveling salesman problem is utilized to dictate the probe movement. Probes are moved in the X,Y-direction and the substrate being tested or the probes are moved in the Z-direction. Contact is made by a combination of X,Y-movement to align the probes above the nodes and a movement in the Z-direction by the probes or the substrate to bring the probes in contact with the substrate. X,Y-translation equipment is utilized that has no microprocessing itself but instead relies on a relatively fast computer such as the AT&T PC6300 together with the rapid communication performed by direct parallel input and output. Motors having acceleration of 56,000 rad/sec$^2$ and terminal velocity of 3000 rpm are also advantageously employed. Utilizing a combination of these factors, for typical hybrid integrated circuits average measurement times including movement as short as 60 msec are achievable.

DETAILED DESCRIPTION

As previously discussed, in one embodiment a two-probe system is employed. Although a two-probe system substantially reduces complications, the testing procedure utilized in the invention does not require that the number of probes be limited to two. The probes, however, should be controlled so that movement between nodes from one measurement to the next is made, irrespective of the net within which the measurement is made (and preferably), irrespective of measurement type, e.g., resistance or capacitance to limit total traveled distance. For example, one approach for reducing measurement distance is to utilize the greedy algorithm approximation of the traveling salesman approach. In this approximation the next set of probe positions is chosen so that the required translation involves the least total distance move from the previous probe positions. The approximation is constrained to use movements which ensure that the probes do not collide and to ensure that all the desired measurements are made. Additionally, resistance and capacitance measurements are also performed in a sequence designed to limit movement without regard to the net being measured.

Figure 1:
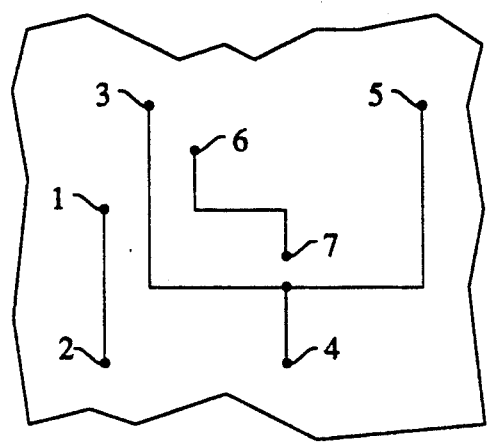
FIG. 1 is illustrative of a portion of a circuit to be measured during practice of the invention.

Exemplary of an advantageous sequence is that associated with a portion of a typical circuit shown in FIG. 1. The order of measurements based on the greedy algorithm approximation is shown with reference to the numbered nodes. Assume the probes being on nodes 3 and 4. If resistance measurements alone were made, the greedy algorithm would proceed by next measuring with probes at 6 and 7 followed by 3 and 5 succeeded by 1 and 2. It should be noted that these measurements do not proceed by finishing one net before continuing to another net. (For pedagogic reasons, the inclusion of capacitance measurements will be discussed later.) The movements are preferably not determined as the measurement proceeds since the process typically is unacceptably time consuming. Generally, for a particular device to be tested, the sequence of movements is determined and the tester is programmed before testing to perform this sequence.

Figure 2:
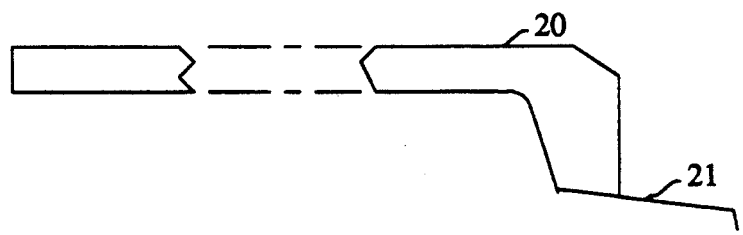
FIG. 2 is illustrative of probes suitable for use in the invention.

The type of probe employed is not critical. For example, a probe such as manufactured by Rucker & Kolls is usefully employed where the arm of the probe 20 in FIG. 2 is substantially parallel to the substrate surface and the contact point 21 extends perpendicularly from the arm. One advantage of this configuration for the contact is that it facilitates measurements on pads with closely spaced centers. Generally, the material utilized in the contact is tungsten, beryllium-copper, or palladium. These materials are chosen so that contact resistance is not excessive and so that mechanical integrity is maintained. The particular method of moving the arm is not critical. For example, commercially available translators such as Aerotech ATS406 are useful. By use of the invention, average move distance is generally sufficiently short so that for most moves translation time is limited by probe acceleration rather than probe maximum velocity. The maximum speed should not be excessively low relative to the distance of the typical move. Thus, it is desirable that the translator have a maximum speed of at least 100 mm/sec for typical moves of 1.5 to 5.0 mm. (Maximum speed is considered the top speed reached by any one axis.) For these maximum velocities and for typical move distances accelerations in the range 5 m/s$^2$ to 15 m/s$^2$ produce desirable results. The average move distance varies with the type of device tested. Typical move distances for hybrid integrated circuits are 3.0 mm, for advanced large scale packaging are 1.5 mm, and for printed circuit boards are 5.0 mm. (Accelerations faster than 15 m/s$^2$, although not precluded, tend to produce mechanical stresses on the equipment that are inconvenient.)

To avoid unnecessary abrasion between the probe and the nodes it is desirable to position, through X,Y-motion, the probes above the node and to employ the Z-motion of the platform upon which the substrate being tested rests to produce contact between the positioned probes and the nodes. Although this configuration has proved advantageous, other configurations are possible. For example, it is possible to employ a stationary platform and probes that move in the Z-direction. It is desirable that the motion of the probes be stopped sufficiently quickly that they do not overshoot the node to be contacted. For large nodes, i.e., larger than 500 $\mu$m as typically encountered in printed circuit boards, overshooting is not a particular concern. For node sizes as small as 100 $\mu$m as encountered in advanced large scale packaging, precaution should be taken to achieve suitable stopping accuracy. For example, this stopping accuracy is obtained by typical expedients such as employing closed loop DC servo-motors or open loop stepper motors with fine pitched lead screws.

Once the probes are positioned, resistance measurements are typically performed by constant voltage or constant current techniques. See, *Principles of Electronic Instrumentation*, by James Difenderfer, W. B. Saunders Co., Philadelphia, PA, pp. 110–113 (1972) for a description of these measurement procedures. Relatively conventional testing equipment is utilized for such measurements. Similarly, capacitance measurements are made by positioning one probe at a node of a net and then removing the second probe from contact with the substrate. This removal of contact of one probe is necessary because the second probe adds capacitance to the net. The capacitance measurement is made in one embodiment as described in U.S. Pat. No. 3,975,680. In one embodiment, an electrically conductive platform for holding the device is employed as the ground plane for making the measurement. Although it is convenient if one probe is to be removed during capacitance measurement, to move it beyond the perimeter of the substrate, this expedient is not required. Indeed, it is possible to move the probe so that after the capacitance measurement is made it is in a location expediting rapid positioning at the next node to be tested.

As previously discussed for many node configurations, measurement speed is further enhanced by interleaving capacitance and resistance measurement. Again, the object is to reduce the distance moved. Thus, in the example illustrated in FIG. 1, an advantageous sequence is: begin with the probes on nodes 3 and 4 and measure the resistance; raise the probe on node 3 and make a capacitance measurement; move the probes to nodes 6 and 7 and make a resistance measurement; raise the probe on node 6 and make a capacitance measurement; move the probes to nodes 3 and 5 and make a resistance measurement; move the probes to nodes 1 and 2 and make a resistance measurement; raise the probe on node 1 and make a capacitance measurement.

Factors other than probe movement contributing to measurement time should be limited. In particular, the total of the additional factors contributing to measurement time averaged over the testing of the entire circuit should be less than 25 percent of ($t_{av}$−SD) where $t_{av}$ is the time to make a move averaged over the testing of the entire circuit and SD is one standard deviation of the ensemble of movement times. Substantial contributing factors to the non-movement measurement time includes the time for communicating orders for movement to the probe, the time for taking the measurement, and the probe settling time. As to the latter factor as previously discussed, the probe should not substantially overshoot the node. Generally, measurement time should be less than 5 msec for resistance measurements and less than 15 msec for capacitance measurements. Such measurement times are achievable by expedients such as the previously described measuring procedures with direct parallel input and output between the central processing unit and all measurement electronics. Rapid communication of instructions to the probe translator is advantageously obtained by utilizing a controller distinct from the probe translator. In particular, it has been found advantageous to utilize a probe that responds to digital signals and a separate expedient, e.g., a computer, to provide these signals. Rapid communication between the computer and the movement controller is advantageously provided by direct parallel input and output with handshaking. Generally, time periods less than 2 msec for communication between the computer and the translator of a complete two-probe movement command including any processing time at the translator is desirable.

Although the previously described measurements produce excellent results, some additional embodiments even further improve these results. For the capacitance measurements acceptable values must be set. If these values are exceeded the substrate being tested is either repaired or discarded. The establishment of these values must be made with reference to the accuracy of the measurement. Typically, in previous measurement schemes, a range encompassing the expected capacitance value is chosen as acceptable. If this range is large, it is often difficult to identify both nets of a pair of shorted nets. If the range is relatively small, for devices such as HIC's the differences in dielectric layer thicknesses and in net metal linewidth often lead to measurement deviations considerably larger than this relatively small range. However, if all the measurement values are proportionally different from the expected value due to a corresponding difference in dielectric layer thickness or metal linewidth, the circuit might well be acceptable even though it does not pass the established criterion.

To avoid this possibility it is advantageous on any substrate to be tested to make test capacitance measurements on a limited number of nets. These test measurements are then compared to the expected values for the nets and a scaling factor determined by computing the ratio of the median measured value to the expected value. This scaling factor is utilized in the measurement of the entire circuit by multiplying the reference (desired) value times the scaling factor and then comparing this adjusted figure to the measured value. By utilizing a scaling factor the inconsistencies from substrate to substrate, as opposed to inconsistencies from node to node, are reduced by averaging and many fewer acceptable circuits are erroneously rejected.

It is possible to determine the net pattern of a particular circuit using the capacitance of each node as a guide. The capacitance of every node is measured. The resistance is measured between pairs of nodes having similar capacitances. (Similarity is generally considered capacitances forming a group with all capacitances within the group having a difference from at least one other group member of no more than a specified percent plus an absolute amount, typically 3 percent and 0.2 pF.) Not all node pairs are measured. Pairs closest in capacitance value are first measured for resistance, and appropriate movement between pairs is determined as described above, for example, by the greedy algorithm. Many passes are made checking nodes with less close capacitance values each time. Once a node is found connected to another, this node need not be tested again during subsequent passes. During each pass, the greedy algorithm is applied by computing while the probes are in motion. The process is complete when all nodes are placed in a group, i.e., net. The following examples are illustrative of the invention.

EXAMPLE 1

The apparatus included a number of component parts. A vacuum chuck for holding the substrate to be measured was mounted on a pedestal. This pedestal had means for translation in the Z-direction. The translation entailed a movement of 0.75 mm in 20 milliseconds. Translation in both the positive and negative Z-direction was done utilizing a positive acting cam.

Two X,Y-translation stages were also provided. These stages were mounted on a common one-inch thick steel plate on opposite sides of the vacuum chuck pedestal. The vacuum chuck pedestal and the X,Y-translation stages were all aligned so that they were in the same X,Y-plane. The translation stages were spaced from the pedestal so that the probe ultimately mounted on each stage could reach over the pedestal to the far side of the substrate mounted on the vacuum chuck. The X,Y-translation directions of each stage were aligned so that both X-directions were parallel and so that the X-directions were perpendicular to the Y-directions. The translation stages were chosen to have a maximum velocity of approximately 250 mm/s and the maximum acceleration of approximately 6 m/s$^2$. The translators were driven by closed loop DC servomotors having rotary encoders. A probe such as shown in FIG. 2 was mounted on each translation stage and cantilevered as described above so that it could reach the far side of the substrate being measured. A tungsten needle having the configuration shown in FIG. 2 was mounted at the end of each probe. The tip of this needle was approximately 50 micrometers in diameter. Micromanipulators were provided for each probe so that the tips of the probes could be positioned in the same X,Y-plane.

For alignment purposes, two video microscopes together with respective video cameras and video displays were provided. These video microscopes were mounted on a common X,Y-stage that was located on the far side of the pedestal from the position the operator occupies during operation. The cameras were cantilevered over the pedestal, were mounted in a common X-direction, and had provision for adjusting the separation of the cameras in this direction. (This arrangement allowed the simultaneous viewing of two alignment marks.)

The cam in the pedestal was controlled by a DC stepper motor having limit flags for up and down positions. The motor was, in turn, controlled by a dedicated circuit board that monitors appropriate up and down positioning. A servo-controller was provided for each X,Y-translation stage. This controller included a linear amplifier, an indexer that translated digital input signals to signals suitable for the linear amplifier, encoder circuitry, limit circuitry, and homing circuitry. The rotary encoder with its electronics provided a minimum step size of 10 micrometers. The controller included circuitry to control the maximum velocity and acceleration of the probe of the X,Y-stage and thus, in turn, the probe. The controllers received input from an AT&T PC6300 personal computer. This computer included an interface board connected to the computer's I/O bus which provided a high speed interconnect between the X,Y-controller and the computer. The computer was also connected through a separate interface to the Z-translation controller of the pedestal. (This signal from the computer instructed the pedestal to move up or down but the distance was controlled in the Z-controller.) The computer circuitry was programmed so that X,Y-motion did not occur simultaneously with Z-motion. (An interlock is also provided so that no X,Y-motion is possible unless a protective member is in place over the probe area.)

The pedestal was configured electrically so that is could, through operation of a relay, be connected to measurement system ground or left electrically isolated. One probe was connected to measurement system ground and the other probe was connected to circuitry suitable for making resistance and capacitance measurements with respect to measurement system ground. The measurement circuitry was conventional and monitored resistance through measurement of current and voltage as well as monitoring capacitance through measurement of RC time constant. (The measurement circuitry for the capacitance was interfaced with the computer which actually does the timing determination.) The analog portion of the measurement circuitry was located near the probes to prevent noise and to reduce stray capacitances. This analog portion of the circuitry was connected to a circuit board in the computer which contains an analog to digital converter and also contains means for providing the timing necessary for capacitance measurements. Circuitry was provided to yield a capacitance resolution of 0.02 pF and a resistance resolution of 0.1 ohm.

The computer has facility for constantly monitoring the measurement circuitry during X,Y-movement. If an electrical signal was detected indicating mechanical contact between the probes, the computer terminated all motion. Through the described circuitry the computer directs the controllers to make appropriate movement and, in turn, the controllers return a signal to the computer indicating that this movement has been accomplished.

Software was provided that allowed communication between a terminal and the electronics. This communication was provided so that English language-type commands were translated into the desired electronic sequences. Through the use of this language software, a list of test point X,Y-locations for the substrate to be tested was loaded into the computer. In addition to this list, a sequence of movements between these test points and a sequence of measurements at the test points were also loaded. Software was also provided for performing real-time processing. In operation, before measurement is begun, the location of two alignment positions was determined utilizing the previously described camera system. This determination was necessary to allow for correction necessitated by variation of substrate placement on the pedestal by the operator. Measurement of alignment locations allowed correction for this variable in test point locations. Before each probe movement the computer corrected the test point location by the adjustment indicated by the alignment measurement. Additionally, the computer checked the path to be followed in the upcoming movement to ensure that a crash between probes did not occur and if such a crash was indicated the computer rerouted the movement to avoid this possibility. (Although if the test sequence is accurate, this check is unnecessary, it, nevertheless, provided an additional check to avoid human errors.)

The initial sequence of tests loaded into the computer were chosen to reduce probe movement by using a variation on the greedy algorithm. Although for convenience this algorithm was applied on a computer that was not electrically connected with the system, it was possible, if desired, to have the test system itself determine an appropriate sequence before initiating measurements. Software was also provided for recording and displaying the test results, for scaling of capacitance measurements and for applying desired tolerances to the electrical measurements. Additionally, software was provided for making a determination of net connectivity when the net pattern was not previously known. Software was provided so that upon encountering a test measurement which indicated a substrate failure, retesting was performed to ensure that the substrate itself rather than the measurement was the source of this failure. To ensure that testing was not slowed by computation, whenever possible computer processing was programmed to be performed during periods when probe movement was also being performed.

In operation, the operator initiated the test sequence. This initiation required only internal loading of the required test movements if a particular substrate to be tested has previously had the associated movements loaded. For a new substrate net configuration, initiation involved the external loading of appropriate movement and measurement sequences. The substrate to be tested was placed on the pedestal and the vacuum chuck activated. For accounting purposes, the operator then entered data identifying the specific substrate being tested. The operator then used the cursor keys on the keyboard to align each probe over its respective alignment marks. To ensure accuracy both probes in sequence were aligned over the first alignment mark and then one of the two probes was aligned over the second alignment mark. The operator then initiated measurement. After the measurement was completed the computer displayed the results of this measurement on the video display.

EXAMPLE 2

The sample apparatus and procedure of Example 1 were utilized except the Z-motion was provided not by the pedestal but instead by movement of the probes. Each probe mount included a rack-and-pinion Z-translator that utilized a closed loop DC motor with rotary encoder. Instead of a pedestal controller, a microprocessor based servo-controller was utilized and this controller was connected directly to the I/O bus of the computer. Z-alignment of the probes was automatically performed by moving the probes so that they both touch an electrically conductive X,Y-plane. Torque generated by Z-translation motion was monitored to ensure that an obstruction such as a non-conductive portion of a substrate had not been contacted by the probes. This system had somewhat greater flexibility than that described in Example 1 since capacitance measurements were possible by having one probe up and one probe down. The system also provided the possibility of testing nodes that were not in the same spatial X,Y-plane.

What is claimed is:

1. A process for fabricating a body having electrically conductive nets that electrically interconnect in a desired pattern a plurality of nodes, said process comprising the steps of examining a plurality of said nets by a series of net tests, said net tests including at least two measurements made on said net to ensure the presence of said desired interconnection pattern and employing said body based on said measurements wherein said measurements are made using a first and second probe to contact said nodes for said measurements characterized in that said measurements are made such that for at least one net all said measurements to be made on said net are not performed before making at least one of said measurements on a second of said nets such that the total movement distance of the said probes for all said measurements is less than the total movement distance for said probes in a sequence wherein each of said net tests is completed before another net test is performed.

2. The process of claim 1 wherein said body comprises a printed circuit board.

3. The process of claim 1 wherein said body comprises a hybrid integrated circuit.

4. The process of claim 1 wherein said body comprises advanced VLSI packaging.

5. The process of claim 1 wherein more than two probes are employed.

6. The process of claim 1 wherein said test includes capacitance measurement.

7. The process of claim 1 wherein said capacitance measurements are scaled.

8. The process of claim 1 wherein the time for testing is dominated by the time taken for said movements.

9. The process of claim 8 wherein said domination is ensured by maintaining a short time for making said measurement, and conveying electrical signals and preparing electrical signals relative to said movement time.

10. The process of claim 1 wherein said probes during said movement accelerate sufficiently fast so that said probes fail to reach maximum velocity before said movement is completed.

11. The process of claim 1 wherein contact between said probes and said body for said test is accomplished by movement including movement of said body in a direction perpendicular to the plane of said body.

12. The process of claim 1 wherein contact between said probes and said body for said test is accomplished by movement including movement of said probes in a direction perpendicular to the plane of said body.

13. The process of claim 1 wherein said constraint is avoided by making said movements between said measurements substantially by moving to the said pair of nodes to be tested closest to the previous pair of nodes in said measurement series.

14. The process of claim 1 wherein each of said nodes is identified as belonging to one of said nets.

* * * * *